United States Patent [19]

Wang et al.

[11] Patent Number: 4,923,822
[45] Date of Patent: May 8, 1990

[54] METHOD OF FABRICATING A SEMICONDUCTOR DEVICE BY CAPPING A CONDUCTIVE LAYER WITH A NITRIDE LAYER

[75] Inventors: Martin S. Wang, Fremont; Kuang-Yi Chiu, Los Altos Hills, both of Calif.

[73] Assignee: Hewlett-Packard Company, Palo Alto, Calif.

[21] Appl. No.: 356,021

[22] Filed: May 22, 1989

[51] Int. Cl.[5] .................................. H01L 21/265
[52] U.S. Cl. ............................. 437/41; 437/200; 437/984
[58] Field of Search .................. 437/200, 984, 41

[56] References Cited

U.S. PATENT DOCUMENTS

| 4,657,628 | 4/1987 | Halloway et al. | 437/200 |
| 4,690,730 | 9/1987 | Tang et al. | 437/200 |
| 4,701,349 | 10/1987 | Koyanaji et al. | 437/241 |

OTHER PUBLICATIONS

IEDM, Dec. 1-4, 1985, vol. ED-33, No. 11 pt. 1, Keneko, et al., "Novel submicrometer MOS Devises by Self-Aligned Nitridation of silicide" pp. 1702-1709.
Rapid Thermal Processing (1986) "Formation of Titanium Nitride/Silicide Bilayers by Rapid Thermal Anneal in Nitrogen" Material Res. Soc. pp. 279-287.
Journal of Vacuum Science Technology A5 (4) Jul.-/Aug. 1987 Ho, et al., "Formation of Self-Aligned TiSi2 for VLSI Contacts and Interconnects" pp. 1396-1401.
Beam-Solid Interactions and Transient Processes Symposium, Dec. 1-4, 1986 Thompson, et al., "The Effects of Processing Ambient on the Reaction Rate of T and Si using Rapid Thermal Processing" pp. 665-73.

Primary Examiner—Brian E. Hearn
Assistant Examiner—Laura Holtzman
Attorney, Agent, or Firm—Herbert R. Schulze

[57] ABSTRACT

A method of fabricating a semiconductor device in an integrated circuit. A conductive titanium layer is deposited on a substrate in which source, drain and gate regions have been created. A titanium nitride layer is applied as a cap over the titanium layer. A first anneal at a relatively low temperature is performed, causing portions of the titanium which are adjacent the silicon surface to form a titanium-silicon compound and causing the remaining titanium and titanium nitride to form a nitride coating. This nitride coating is etched away and a final high-temperature anneal is performed, resulting in thick, smooth titanium silicide ($TiSi_2$) layers on the source and drain regions and gate pads.

9 Claims, 4 Drawing Sheets

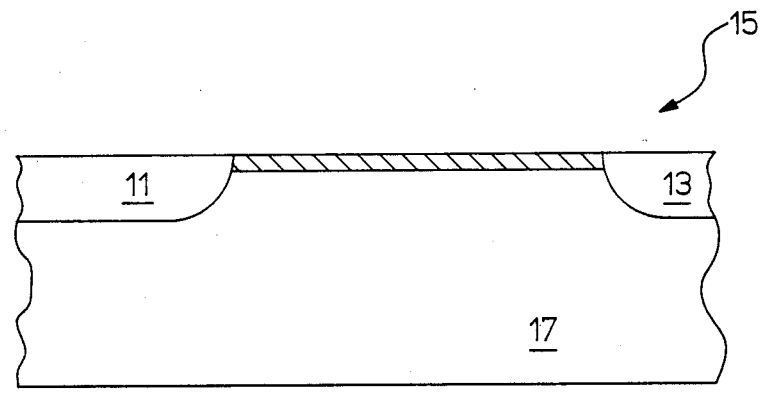
FIG_ 1
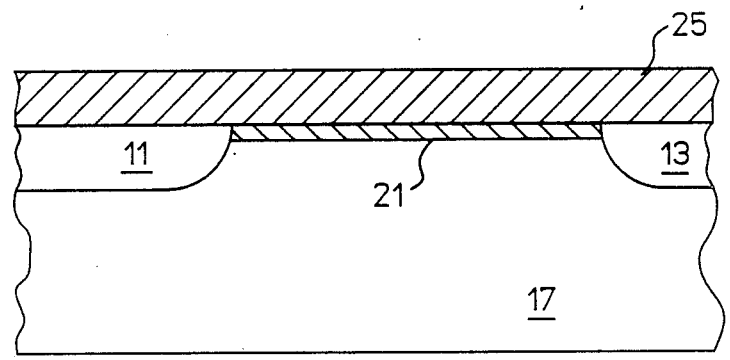
FIG_ 2

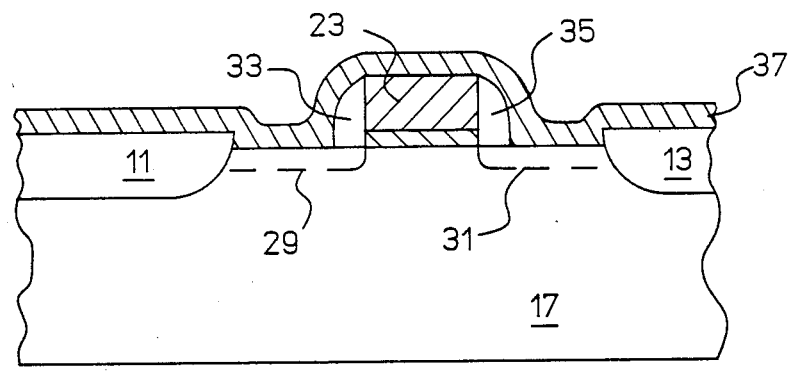
FIG_ 5
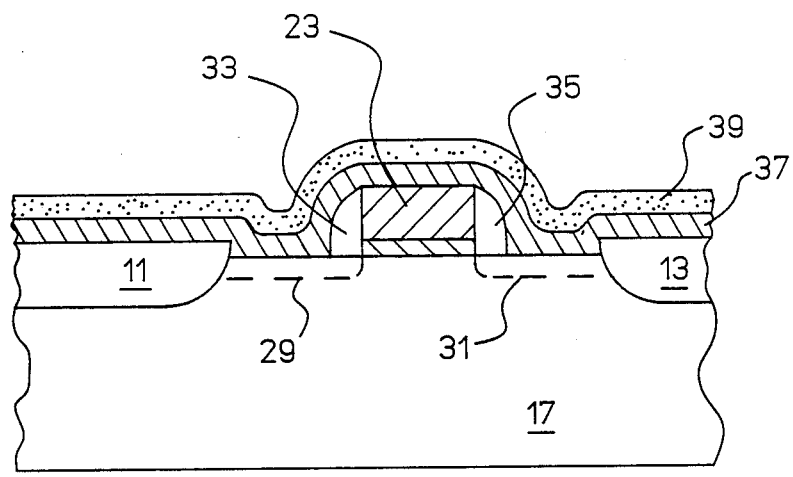
FIG_ 6

METHOD OF FABRICATING A SEMICONDUCTOR DEVICE BY CAPPING A CONDUCTIVE LAYER WITH A NITRIDE LAYER

BACKGROUND OF THE INVENTION

This invention relates generally to integrated circuits and more particularly to a novel method of fabricating a semiconductor device in an integrated circuit by capping a conductive layer with a nitride layer during salicidation.

In recent years the advancement of very large scale integration ("VLSI") technology has resulted in a need to fit more and more individual semiconductor devices such as transistors into smaller and smaller areas of an integrated circuit chip. The dimensions of these devices have reached the submicron range, and it has become increasingly difficult to make adequate electrical contacts for interconnecting such devices.

A relatively recent development in the art of fabricating semiconductors has been the self-aligning silicide process ("salicidation"). During this process successive layers of a conductive material and silicon are deposited over a substrate and then are annealed at a high temperature, forming a conductive silicide layer which then can be utilized for the establishment of electrical contacts with the various regions of the device. This process offers numerous advantages including reduced parasitic resistance in gate, diffusion and interconnect areas of the device and improved circuit packing density.

Titanium is nearly always used as the conductive material because the annealing of titanium and silicon yields titanium silicide ($TiSi_2$) which is characterized by relatively low resistivity and good thermal stability and because of the ability of titanium to dissolve silicon native oxide during annealing to form silicide more consistently than other conductive materials.

Successful formation of titanium silicide is dependent on an absence of impurities between the titanium and the silicon. Any thin oxide or polymer residue left over from a previous step can prevent silicide formation. In addition, titanium reacts readily with any traces of oxygen that may be present. Oxygen contamination in the furnace must be less than about three parts per million ("PPM") in order to prevent such a titanium-oxygen reaction and permit the formation of titanium silicide to proceed reliably. This requires a leakproof system and a high rate of flow of very pure nitrogen gas during wafer loading and annealing, requirements which make the process costly to carry out and difficult to repeat.

Moreover, to successfully accomplish salicidation in a device having dimensions in the submicron range requires the solution of several other problems, among them minimizing drain-to-gate, source-to-gate, and junction leakage, preserving gate oxide integrity, and avoiding any adverse effects of dopant restribution or discontinuity of long polycides.

As a result of all these limitations, the depositing of the titanium and the subsequent high-temperature annealing are extremely difficult to control.

It has been proposed (Tang, T., C. C. Wei, R. Haken, H. Kawasaki, and R. Chapman in Symposium on VLSI Technology 1988, page 69) to add a sacrificial dielectric cap layer after depositing the titanium and strip back after sintering. However, the etch back process which must be performed as part of this technique has created many device and process complexities.

From the foregoing it will be apparent that there remains a need for a practical way to obtain the benefits of salicidation during fabrication of a semiconductor device.

SUMMARY OF THE INVENTION

The present invention provides a method of realizing the benefits of the self-aligning silicide process in fabricating a semiconductor device by capping a conductive layer with a nitride prior to annealing. The resulting structure is relatively immune from any adverse effects of the presence of oxygen or other contaminants during the deposit of the conductive layer and the subsequent annealing and therefore gives improved yield while reducing the cost of fabrication.

Briefly and in general terms, the invention is embodied in a method of fabricating a semiconductor device by means of the following steps: forming field oxide regions in a planar surface of a substrate; creating a gate region between the oxide regions; forming source and drain diffusion regions in the substrate; covering the substrate with a conductive layer such as titanium; covering the conductive layer with a nitride such as titanium nitride; annealing at a relatively low temperature to form a silicon compound wherever the conductive material is touching silicon and to combine any remaining conductive material with the nitride to form a generally homogeneous layer of nitride covering the device; etching to remove the nitride; and annealing at a relatively high temperature to convert the silicon compound into a silicide.

Preferably the nitride is deposited immediately after the conductive material, for example by reactive sputtering, without any change in ambient atmosphere. The ambient atmosphere is preferably nitrogen.

The etching preferably comprises wet etching, for example with sulfuric acid or ammonium hydroxide.

The gate region is created, for example, by forming a gate oxide layer on the substrate and forming a silicon pad on the gate oxide layer. The diffusion regions are formed, for example, by coating the pad and the substrate with a dielectric layer, directionally etching the dielectric layer to provide oxide spacers around the pad, and performing ion implantation and drive-in to form the diffusion regions. The pad itself can be formed by depositing a polysilicon layer over the gate oxide layer and then etching the polysilicon and the underlying gate oxide.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 1 is an enlarged sectional view of a semiconductor device being fabricated according to the method of the invention after the step of forming field oxide regions and including a gate oxide layer therebetween;

FIG. 2 shows the device of FIG. 1 after forming a polysilicon layer over the field and gate oxide regions;

FIG. 5 shows the device of FIG. 4 after covering with a conductive layer;

FIG. 6 shows the device of FIG. 5 after covering with a nitride layer;

DESCRIPTION OF THE PREFERRED EMBODIMENT

Figure 3:
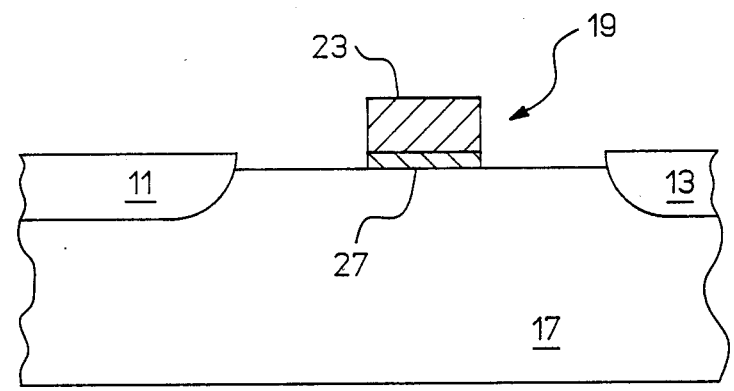
FIG. 3 shows the device of FIG. 2 after etching the polysilicon layer and the gate oxide layer to form a gate region.
Figure 4:
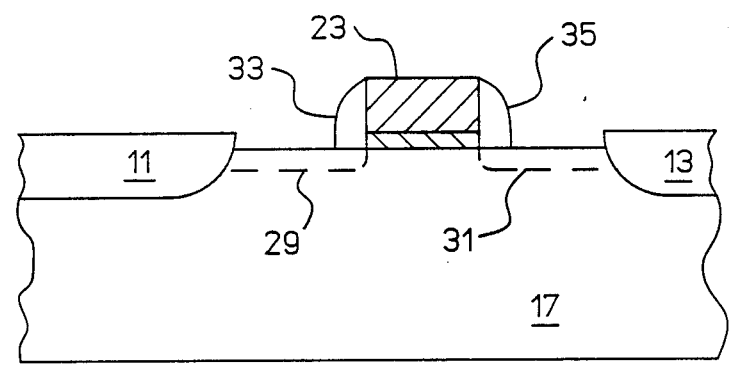
FIG. 4 shows the device of FIG. 3 after forming source and drain regions.

As shown in the drawings for purposes of illustration, the invention is embodied in a method of fabricating a semiconductor device by capping a conductive layer with a nitride layer during salicidation.

There has been a continuing effort to fit more and more semiconductor devices onto an integrated circuit chip. As the dimensions of these devices have become smaller, it has become more and more difficult to fabricate adequate electrical connections with the devices. Forming such contains by salicidation offers numerous benefits, butt it has been difficult to achieve consistent results due to the extreme vulnerability of this process to the effects of very small concentrations of impurities and the need to solve various other problems associated with salicidation.

During salicidation, a layer of conductive material such as titanium is deposited over a partially-formed semiconductor device. According to the method of the present invention, this conductive layer is covered with titanium nitride rather than silicon, a low temperature anneal is performed, and any excess nitride is etched away. A high temperature anneal completes the salicidation. This novel process results in the formation of a smoother and thicker layer of titanium silicide than existing methods of salicidation and is easier to carry out because it is relatively immune from any adverse effects of impurities.

More particularly, FIGS. 1 through 8 illustrate successive stages of the fabrication of a semiconductor device according to a preferred embodiment of the method of the invention. Spaced-apart first and second field oxide regions 11 and 13 are formed in a planar surface 15 of a substrate 17, and a gate region generally designated 19 is created between the field oxide regions 11 and 13.

The gate region 19 is preferably created by forming a gate oxide layer 21 in the planar surface 15 of the substrate 17 and forming a silicon pad 23 on the gate oxide layer 21 to create the gate region 19. The silicon pad 23 is formed, for example, by forming a polysilicon layer 25 over the gate oxide 21 and then etching the polysilicon layer 25 and the underlying gate oxide 21, a portion 27 of the gate oxide layer 21 remaining under the silicon pad 23 after this etching.

Next a source diffusion region 29 is formed between the gate region 19 and the first field oxide region 11, and a drain diffusion region 31 is formed between the gate region 19 and the second field oxide region 13. The diffusion regions 29 and 31 are preferably formed by coating the pad 23 and the substrate 17 with a dielectric layer, directionally etching the dielectric layer to provide oxide spacers 33 and 35 around the pad 23, and performing ion implantation and drive-in to form the diffusion regions 29 and 31.

Then the device is covered with a conductive layer 37 such as titanium, and the conductive layer 37 in turn is covered with a nitride layer 39 such as titanium nitride. The nitride layer 39 preferably reactively sputtered on immediately after deposition of the conductive layer 37 without breaking vacuum or changing the ambient atmosphere.

Figure 7:
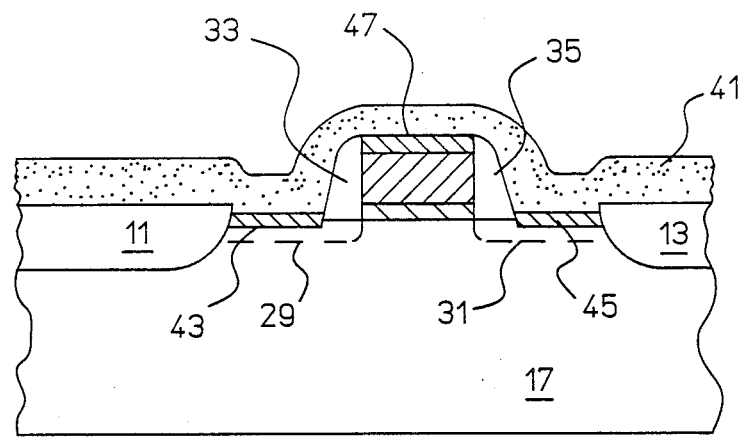
FIG. 7 shows the device of FIG. 6 after annealing at a low temperature.
Figure 8:
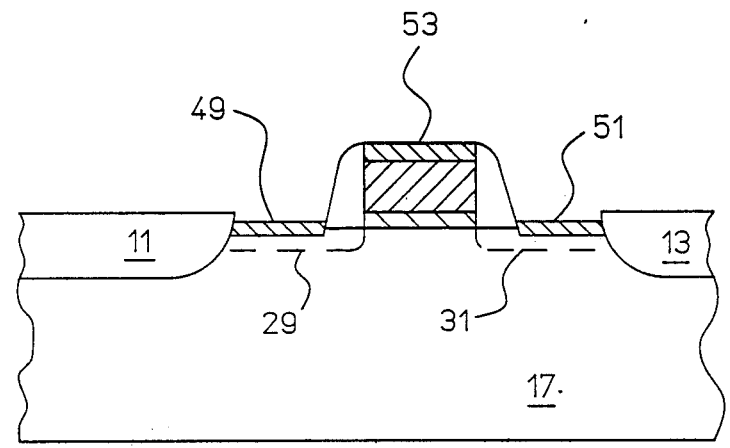
FIG. 8 shows the device of FIG. 7 after etching to remove the nitride and annealing at a high temperature.

The next step is annealing at a relatively low temperature whereby those portions of the conductive layer 37 which overlie silicon react therewith to form a conductive silicon compound such as a titanium silicon compound of the form $SiNi_x$ and any remaining portions of the conductive layer 37 react with the nitride layer 39 to form a generally homogeneous nitride layer 41 covering the device, as best shown in FIG. 7.

More particularly, that portion of the conductive layer 37 which immediately overlies the source region 29 reacts with the silicon at the surface 15 of the substrate 17 to form a conductive layer 43 of silicon compound on the source region 29. Similarly, a conductive layer 45 of silicon compound is formed on the drain region 31 and a conductive layer 47 of silicon compound is formed on the pad 23.

Then the nitride layer 41 is removed by etching, preferably in a wet etch by means of a solution of sulfuric acid, ammonium hydroxide or the like. The solution preferably includes hydrogen peroxide, for example in a ratio of two parts of sulfuric acid to one part of hydrogen peroxide.

Finally, a second annealing at a relatively high temperature converts the layers 43, 45 and 47 into silicide (such as titanium silicide $TiSi_2$) layers 49, 51 and 53, respectively.

The nitride layer 39 plays several important roles during the first anneal. One, it prevents the titanium (or other conductive material) of which the layer 37 is comprised from reacting with the ambient nitrogen atmosphere. This forces the titanium to dissolve any oxide residue which may have formed on the surface of the device prior to deposition of the layer 37 and "snow-plow" the oxygen from the residue into the nitride layer 41. Then this unwanted oxygen is removed when the nitride is etched away.

Another role played by the nitride layer 39 is to force that portion of the titanium which is immediately adjacent the silicon surfaces to react therewith to form the silicide, thereby alleviating the strict requirements of titanium-silicon interface cleanliness.

In addition, silicide formation according to the method of the invention is much less subject to adverse effects of oxygen contamination of the ambient atmosphere during high temperature annealing. Whereas conventional salicidation requires an atmosphere having less than about three PPM of oxygen, the method of the invention works even if oxygen is present in amounts of 10,000 PPM. Residue oxide dissolubility can be as much as about 75 Angstroms as opposed to 35 Angstroms for conventional salicidation.

The titanium silicide which results from the process of the invention is smoother and thicker than that which can be obtained by conventional methods. Surface morphology of titanium silicide formed by the method of the invention is about 50 Angstroms as opposed to 1,500 Angstroms when formed by conventional methods. The interface roughness between the titanium silicide and the underlying silicon, for example the source and drain regions 43 and 45, is about 20 Angstroms in opposed to 200 Angstroms in devices formed in other ways.

Not only can semiconductor devices be fabricated more reliably and less expensively according to the method of the invention, but in addition the electrical parameters of devices fabricated according to the invention have been found to be significantly superior to those of conventionally-made devices, as can be seen by reference to the following Table 1:

TABLE 1

Comparison of Silicide-Related, Electrical, Parameters

| Parameter | Invention | Conventional |
|---|---|---|
| Field leakage current (amps) | 1e-11* | 8e-10 |
| N-Well leakage current (amps) | 2e-10 | 2e-9 |
| Substrate leakage current (amps) | 2e-11 | 5e-7 |
| NMOS G/S,D leakage current (amps) | 5e-12 | 2e-10 |
| PMOS G/S,D leakage current (amps) | 1e-11 | 5e-9 |
| Area gate cap leakage current (amps) | 6e-10 | 3e-10 |
| Peri gate cap leakage current (amps) | 2e-10 | 5e-9 |
| Drain saturation current (amps) | 7.3e-3 | 7.2e-3 |
| N+ island Rs (ohm/sq) | 1.6 | 2.8 |
| P+ island Rs (ohm/sq) | 1.4 | 2.4 |
| N+ poly Rs (ohm/sq) | 1.9 | 3.6 |
| PMOS series resistance (ohms) | 90 | 400 |
| NMOS series resistance (ohms) | 50 | 48 |

From the foregoing it will be apparent that the present invention provides a novel method of fabricating a semiconductor device by capping a conductive layer with a nitride layer prior to annealing during the formation of conductive silicides. Fabrication of semiconductor devices according to the method of the invention is more reliable, consistent and economical than is fabrication according to other methods. Titanium silicides formed according to the invention are thicker and smoother than those formed by other means, and semiconductor devices having such silicides have superior electrical characteristics.

Although certain specific embodiments of the invention have been described and illustrated, the invention is not be limited to the specific steps, forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. A method of fabricating a semiconductor device, the method comprising:

forming spaced-apart first and second field oxide regions in a planar surface of a substrate;

creating a gate region between the field oxide regions;

forming a source diffusion region between the gate region and the first field oxide region and a drain diffusion region between the gate region and the second field oxide region;

covering the substrate with a conductive layer;

covering the conductive layer with a nitride layer;

annealing at a relatively low temperature whereby those portions of the conductive layer which overlie silicon react therewith to form a silicon compound and any remaining portions of the conductive layer react with the nitride layer to form a generally homogeneous nitride layer covering the device;

etching to remove the nitride layer; and annealing at a relatively high temperature to convert the silicon compound into a silicide.

2. A method according to claim 1 wherein the conductive layer comprises titanium and the nitride layer comprises titanium nitride.

3. A method according to claim 2 wherein the titanium nitride coating is applied immediately after the titanium coating without any change in ambient atmosphere.

4. A method according to claim 1 wherein the etching comprises wet etching.

5. A method according to claim 4 wherein the wet etching is performed by means of sulfuric acid.

6. A method according to claim 4 wherein the wet etching is performed by means of ammonium hydroxide.

7. A method according to claim 1 wherein the step of creating a gate region comprises forming a gate oxide layer in the planar surface of the substrate and forming a silicon pad on the gate oxide layer to create the gate region.

8. A method according to claim 7 wherein the step of forming the diffusion regions comprises:

coating the pad and the substrate with a dielectric layer;

directionally etching the dielectric layer to provide oxide spacers around the pad; and performing ion implantation and drive-in to form the diffusion regions.

9. A method according to claim 7 wherein the step of forming the pad comprises forming a polysilicon layer over the gate oxide and then etching the polysilicon layer and the underlying gate oxide.

* * * * *

UNITED STATES PATENT AND TRADEMARK OFFICE
CERTIFICATE OF CORRECTION

PATENT NO. : 4,923,822
DATED : May 8, 1990
INVENTOR(S) : Wang et al.

It is certified that error appears in the above-identified patent and that said Letters Patent is hereby corrected as shown below:

In Column 3, Line 22, "butt" should read --- but ---;

In Column 1, Line 58, "restribution" should read --- redistribution ---;

In Column 4, Line 9, "$SiNi_x$" should read --- $TiSi_x$ ---.

Signed and Sealed this

Twelfth Day of November, 1991

Attest:

HARRY F. MANBECK, JR.

*Attesting Officer*  *Commissioner of Patents and Trademarks*